United States Patent
Cramer et al.

(10) Patent No.: US 6,486,826 B1
(45) Date of Patent: *Nov. 26, 2002

(54) ARRANGEMENT FOR THE PRECISE DISTANCE MEASURING, IN PARTICULAR THE FILLING LEVEL MEASURING

(75) Inventors: Stefan Cramer, Lampertheim; Berthold Zimmermann; Rolf Gluth, both of Blaustein, all of (DE)

(73) Assignee: EADS Deutschland GmbH, Ottobrunn (DE)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/277,956

(22) Filed: Mar. 29, 1999

(30) Foreign Application Priority Data

Mar. 27, 1998 (DE) .......................................... 198 13 604

(51) Int. Cl.⁷ ............................................. G01S 13/32
(52) U.S. Cl. ........................... 342/124; 342/89; 342/98; 342/102; 342/103; 342/118; 342/120; 342/122; 342/123; 342/128
(58) Field of Search ................ 73/290 R; 342/118–124, 342/127–136, 145, 195, 200, 201, 89–103

(56) References Cited

U.S. PATENT DOCUMENTS 4,965,533 A 10/1990 Gilmore
5,210,539 A * 5/1993 Voyce .................... 342/200 X
6,114,987 A * 9/2000 Bjornholt .................... 342/200

FOREIGN PATENT DOCUMENTS

| DE | 3342057 A1 | * 5/1985 | ........... G01S/13/32 |
| EP | 0 434 066 A | 6/1991 | |
| EP | 0 599 609 A1 | 6/1994 | |
| EP | 0 647 857 A | 4/1995 | |
| EP | 0 793 348 A | 9/1997 | |

OTHER PUBLICATIONS

Griffiths, H.D., "New Ideas In FM Radar," *Electronics and Communication Engineering Journal*, Institution of Electrical Engineers, London, GB, Bd. 2, Nr. 5, Oct. 1, 1990 (Oct. 1, 1990), Seiten 185–194, XP000170943 ISSN: 0954–0695.

* cited by examiner

Primary Examiner—Bernarr E. Gregory
(74) Attorney, Agent, or Firm—Venable; Norman N. Kunitz

(57) ABSTRACT

An arrangement for the precise measuring of the distance with a FMCW radar device having a frequency-variable digitally-actuated oscillator to generate a transmitting frequency which can be tuned over a predetermined frequency range. The digital actuation involves the use of a digital frequency generator which derives in predetermined frequency steps a references signal from a fixed-frequency oscillator signal. The frequency of the frequency-variable oscillator is adjusted in a phase-locked loop linking it to the references signal.

11 Claims, 3 Drawing Sheets

ARRANGEMENT FOR THE PRECISE DISTANCE MEASURING, IN PARTICULAR THE FILLING LEVEL MEASURING

CROSS-REFERENCE TO RELATED FOREIGN APPLICATION

This application claims the priority of Patent Application No. 198 13 604.8 filed in Germany on Mar. 27, 1998, the subject matter of which application is incorporated herein by reference.

BACKGROUND OF THE INVENTION

The present invention relates to an arrangement for the precisely measuring distance, in particular, for measuring the level of a liquid in a tank.

There exist various arrangements for measuring the filling level of a liquid in a tank, in particular in large tank plants, some involving various mechanical arrangements. Among the existing arrangements are arrangements incorporating a radar device which measures, starting from a fixed height, the distance to the liquid surface, i.e., the radar device measures the length of the empty space between the fixed height and the top of the liquid level in the tank. The radar device may be a FMCW radar device having operating frequencies in the microwave range.

The operating frequency of the radar device is tuned continuously, for example in equidistant frequency steps which ideally form over time a stair-like course with small steps along a linear ramp of the operating frequency. The operating frequency typically is generated in a frequency-variable, controllable oscillator, in particular a VCO or is derived from the output signal of such an oscillator through frequency multiplication.

The oscillator is normally actuated by a digital/analog converter by gradual change of the control voltage. In order to control the actual oscillator frequency, the oscillator output signal can be supplied to a counter by using the constant frequency of a fixed frequency oscillator as frequency standard, which can, if necessary, be followed by an initial frequency division. If the measured oscillator frequency deviates from the listed frequency, the tuning voltage for the digital/analog converter can be adjusted by a correction value. The correction values can also be determined during a calibration phase and can be considered in the oscillator control in the form of corrected tuning voltages of a non-linear oscillator characteristic.

Calibrating the oscillator characteristic by determining corrected tuning voltages at several or all of the frequency stages of the oscillator frequency tuning range requires a time interval which, due to the frequency measuring time of the counter, as a rule far exceeds the duration of a tuning operation to obtain a sufficiently high measuring accuracy of the counter in the frequency range for the filling level. Due to the fact that the operating conditions of the oscillator will change over time, a new calibration has to be carried out at short time intervals.

It has, moreover, been found that after specifying a new control voltage value, the oscillator does not change to a new, constant frequency value, but that following a quick jump in the frequency, the oscillator frequency continues to change in the following interval with constant control voltage. These undesirable frequency changes are primarily caused by the temperature dependence of the oscillator characteristic. In this case, temperature fluctuations are caused not only by changes in the environmental temperature, but also, and above all, by changes in the power consumption of the oscillator itself or in neighboring control circuits. The effects of these temperature changes on a semiconductor substrate or a carrier ceramic have much shorter time constants than the interruptions caused by changes in the environmental temperature.

In view of the above, the mean value of the measured frequency is not identical to the actual, drifting oscillator frequency. The calibration of the oscillator characteristic is less secure than is permissible for the desired measuring accuracy with a range resolution in the order of magnitude of one millimeter or a few millimeters. The same problems occur if a frequency ramp with continuous linear rise over time is to be generated in place of the step-by-step frequency tuning.

It is, therefore, the object of the invention to specify an arrangement for the distance measuring, in particular the filling level measuring, by using a FMCW radar device, which arrangement ensures an improved, targeted adjustment of the changeable operating frequency and thus a reliable and precise distance measuring.

BRIEF DESCRIPTION OF THE INVENTION

With the object in view, the present invention resides in an arrangement for carrying out a precise distance measurement, in particular for measuring the tilling level of a liquid inside a tank by means of a FMCW radar device, in which a frequency-variable oscillator is actuated with digital means to generate a transmitting frequency which can be tuned over a predetermined frequency range. The digital means comprise a digital frequency generator which derives in predetermined frequency steps a reference signal from a fixed-frequency oscillator signal and the frequency of the frequency-variable oscillator is adjusted in a phase-locked loop by linking it to the reference signal.

The arrangement according to the present invention makes it possible to achieve, at a low cost, a reliably high measuring accuracy in the range of one to several millimeters for measuring distances up to approximately 50 m, this being done by generating a linear frequency ramp with predetermined slope or exact frequency steps, which are for the most part independent of external influences such a temperature and component scattering, as well as the less than ideal characteristics of the oscillator. In this case, the transmitting frequency range advantageously can be above $10^{10}$ Hz. The invention can, for the most part, use standard electronic components, particularly components from the digital electronic field and the high-frequency electronic field, such as DDS modules and/or PLL modules. Components requiring a discrete design and/or implementation are used for special application cases. Available components can be modified.

The method of generating the FMCW radar frequency ramp, continuously or in steps, which is used in accordance with the invention makes advantageous use of the principles of the digital direct synthesis (DDS), known per se, the so-called fractional-N-frequency generators and/or the phase-locked loops (PLL). As a rule, inexpensive and readily available prefabricated components can be used for this. A detailed explanation of the aforementioned methods can be found, for example, in the literature references [1] and [2], set forth at the end of this specification.

The noise portion of the transmitting signal, which is based on phase fluctuations of the oscillator output signal, is reduced at the same time, inasmuch as the phase-locked loop adjusts the oscillator output signal to a constant phase position with respect to the reference signal that is present with high precision.

The phase-locked loop typically has a divider with a whole number divider ratio N, so that the oscillator signal is adjusted to N-times the reference signal. The accuracy of the oscillator frequency essentially depends only on the accuracy of the reference frequency. The non-linear connection between tuning voltage and oscillator frequency, as well as the temperature dependence of the oscillator, do not play a role in this case. A phase-locked loop makes it possible to adjust the transmitting frequency quickly to a specific value, determined by the reference frequency and the dividing factor, and to stabilize it against changes caused by temperature fluctuations. If, for a constant dividing factor of the phase-locked loop, the reference frequency is changed linearly or in defined, predetermined steps over a period of time, then a special linear frequency ramp or a defined sequence of frequency steps with exact step frequencies also results for the oscillator signal and the transmitting signal, derived thereof either directly or preferably after the frequency division.

The use of a phase-locked loop causes as shift in the linearity requirements from direct control by the oscillator to generating an exact reference signal, which can be located in a much lower frequency range. The frequencies for the transmitting signal and thus also the oscillator signal should be adjustable in very small steps, so that the derivation of the reference signal through frequency division of a frequency standard cannot be realized with acceptable expenditure in the frequency range considered herein. However, if a high divider factor N in the phase-locked loop and a low reference frequency in the range of several MHz are advantageously selected, then the reference signal advantageously can be generated digitally and with high accuracy by using the above described techniques.

BRIEF DESCRIPTION OF THE DRAWINGS

The invention is illustrated in the accompanying drawings.

DETAILED DESCRIPTION OF THE PREFERRED EMBODIMENT

Figure 1:
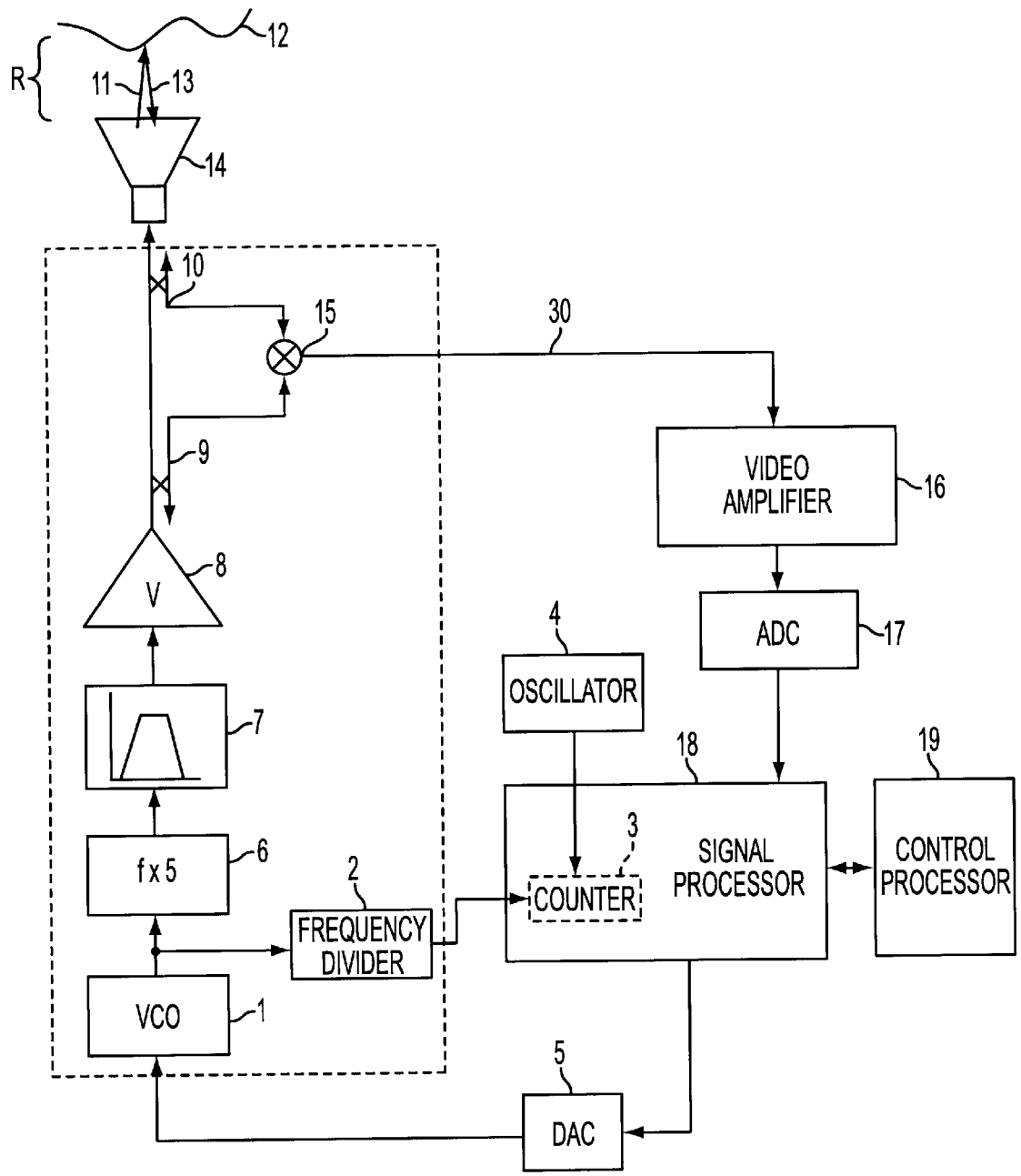
FIG. 1—Shows a block diagram of an arrangement according to prior art.

In the prior art arrangement for measuring the filling level with the aid of a FMCW radar device shown in FIG. 1, the transmitting frequency VCO1 is modulated to assume a ramp-like shape. Its output signal frequency is increased by a constant factor via an optional frequency multiplier 6. Interfering signal components are filtered out in a band-pass filter 7 and the interference-free signal is amplified in the operating frequency in a transmitting amplifier 8 and transmitted via an antenna 14 as transmitting signal 11 in the direction of the surface 12 of a liquid inside a tank. Following transit through the empty space, a portion of the transmitting signal is then reflected at distance R from the antenna at the surface of the filling good. The reflected wave 13 is received via antenna 14 and is fed via a first directional coupler 10 to a mixer 15. A small portion of the transmitting signal is coupled out via a second directional coupler 9 and fed to the other input of mixer 15. A video signal 30 is generated through superimposing the transmitting signal on the reflected signal and, if necessary, taking further processing steps that are known per se. The video signal is a sine-shaped oscillation of the frequency $f_B$, from which the distance R can be determined to be $$R'=c/2 \cdot f_B \cdot T/B$$

with B as frequency slope for the frequency ramp, T as duration for the frequency ramp and c as speed of light.

A high measuring accuracy in the millimeter range can be achieved only if one has exact knowledge of the variables B and T and a transmitting frequency ramp that is as linear as possible.

With the arrangement shown in FIG. 1, the frequency ramp is generated as frequency step sequence by adjusting the tuning voltage of the VCO1 with a digital/analog converter 5 in a predetermined constant time pattern TA. The time pattern is derived, for example, from a fixed frequency oscillator 4. The connection between the tuning voltage and the oscillator frequency at the VCO output can be determined by measuring the oscillator frequency. The output signal from the VCO is supplied to a frequency divider 2 for this, and the frequency of the signal obtained in this way is measured in a counter 3 by using the frequency of the fixed frequency oscillator 4 as frequency standard. The normally non-linear connection between the tuning voltage and the transmitting frequency can be linearized subsequently with the aid of the digital/analog converter 5 through the output of a corrected tuning voltage. The arrangement has the previously described disadvantages.

The complete operational sequence in the radar device is handled by a signal processor 18 and a control processor 19, wherein the analog video signal 30 is supplied once more to the signal processor, if applicable following transit through a video amplifier 16 and an analog/digital converter 17.

Figure 2:
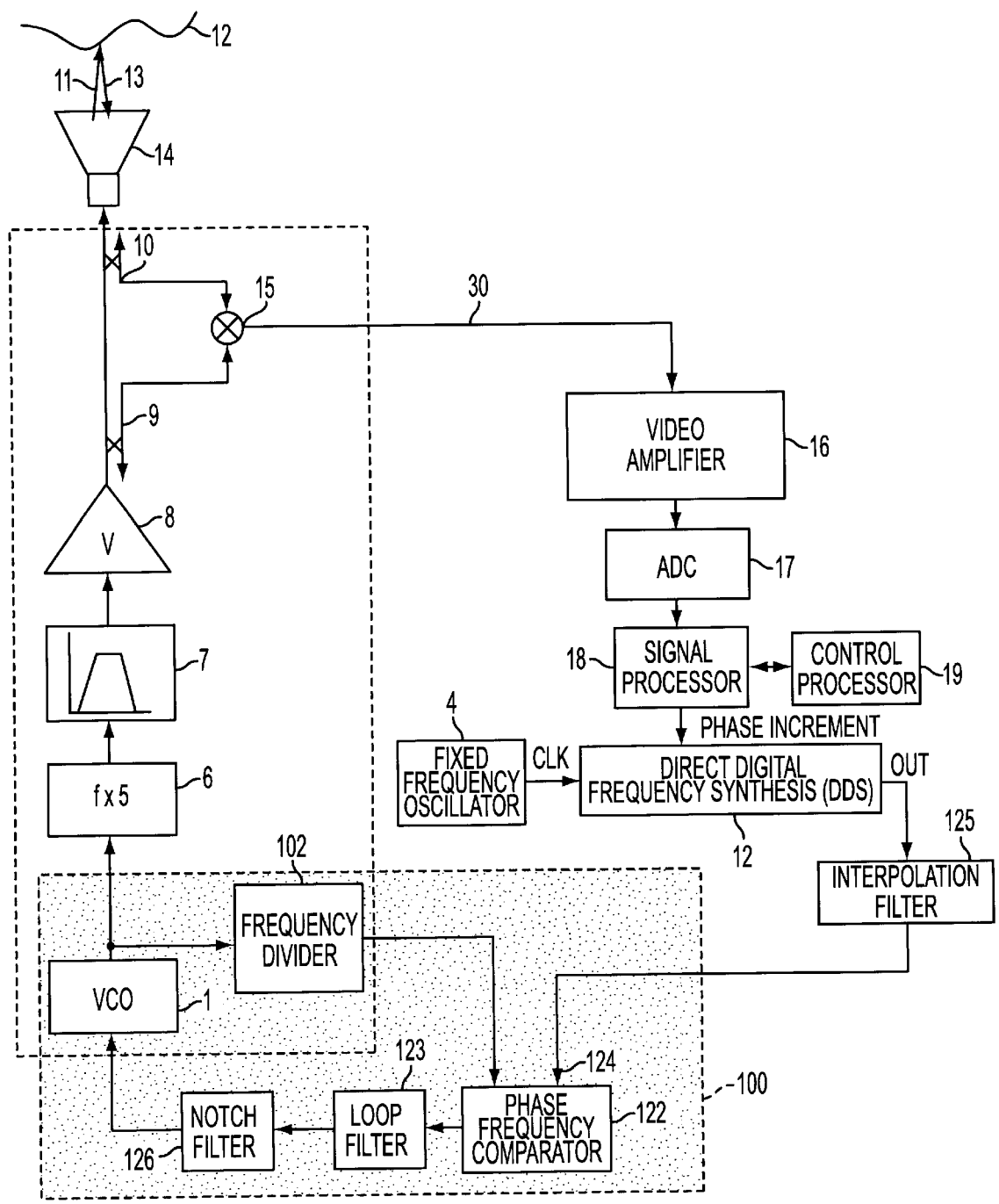
FIG. 2—Shows a block diagram of an arrangement according to the invention.

FIG. 2 shows an arrangement according to the invention, which also operates based on the principle of the FMCW radar (or based on its special case of the stepped frequency radar with stepped frequency ramp). Components functioning in the same way and elements and signals are provided with the same reference numerals as are shown in FIG. 1. In the embodiment shown in FIG. 2, the controllable oscillator 1 is integrated into a frequency control loop 100 which has a frequency divider 102 with high divider factor for the output signal from oscillator 1. The oscillator signal at the output of divider 102, which has been divided down to a considerably lower frequency, is supplied to a phase/frequency comparator 122, which then compares this signal to a reference signal 124 and emits an adjustment signal that depends on a detected phase difference. The adjustment signal is fed as control signal to the oscillator 1 by way of a loop filter 123 of the PLL and an optional notch filter 126.

In order to obtain high frequency accuracy of the oscillator signal, the reference signal must give great precision. The reference signal in the illustrated embodiment is generated based on the principle of the digital direct frequency synthesis DDS. The DDS generator is known per se and is shown in further detail in FIG. 3. The DDS generator operates with the Clk clock pulse of a frequency-stabilized, fixed frequency oscillator 4. The signal processor specifies a phase increment as variable adjustment value, which determines the reference signal frequency. The output signal from the DDS generator 120 is guided over a reconstruction filter (interpolation filter) 125, the output signal of which serves as reference signal. The frequency stability is determined only by the stability of the clock pulse frequency of the fixed-frequency oscillator 4. Fixed-frequency oscillators having high, temperature-compensated frequency stability are commercially available.

Figure 3:
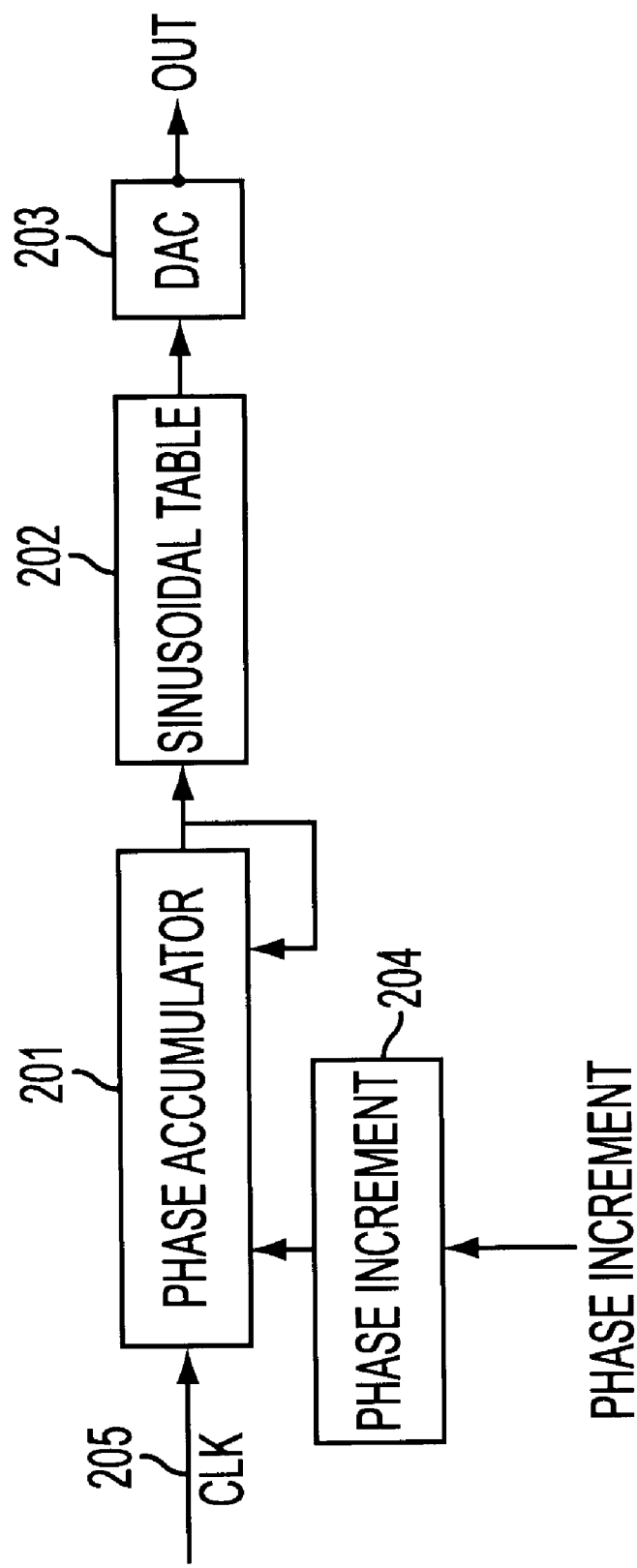
FIG. 3—Shows the principle of a DDS frequency generator.

FIG. 3 shows the operating principle for a DDS frequency generator, there being a signal processor which specifies a phase increment that is stored in a temporary memory 204. With each clock pulse of a clock signal 205, a phase accumulator increases a digital phase value by the predetermined phase increment. The sequence of accumulated digital phase values addresses a sine table 202 which issues amplitude values for a sinusoidal oscillation at its output, in a sequence of digital values that correspond to the phase values. This sequence of digital amplitude values is put out in a digital/analog converter 203 as a sinusoidal signal having a frequency that is determined by the phase increment and the clock frequency Clk. The frequency of the reference signal can be changed by specifying a different phase increment without phase shift.

It will be understood that the above description of the present invention is susceptible to various modifications, changes and adaptations, and the same are intended to be comprehended within the meaning and range of equivalents of the appended claims.

REFERENCES

[1] James A. Crawford: "Frequency Synthesizer Design Handbook," Artech House, Boston, 1994.

[2] "Hybrid PLL/DDS Frequency Synthesizers," Qualcomm Application Note, June 1990.

What is claimed is:

1. An arrangement for precisely measuring distance with a FMCW radar device having a frequency-variable oscillator actuated by digital means to generate a transmitting frequency that is tunable over a predetermined frequency range, with said digital means comprising a digital frequency generator that derives, in predetermined frequency steps, a reference signal from a fixed-frequency oscillator signal, with the frequency of the frequency-variable oscillator being adjusted in a phase-locked loop by comparing the oscillator frequency to the reference signal.

2. An arrangement according to claim 1, wherein said digital frequency generator is a digital direct frequency generator.

3. An arrangement according to claim 1, wherein said digital frequency generator is a fractional-N-generator.

4. An arrangement according to claim 1, wherein said transmitting frequency is greater than $10^{10}$ Hz.

5. An arrangement according to claim 1, wherein a dwell time for each frequency step is less than 500 $\mu$s.

6. An arrangement according to claim 1, wherein a dwell time for each frequency step is less than 200 $\mu$s.

7. An arrangement according to claim 1, wherein the distance to be measured is the distance to a level of a liquid inside a tank.

8. An arrangement for precisely measuring distance with a FWCW radar system comprising:

a frequency-variable oscillator for generating a transmitting frequency that is tunable over a predetermined frequency range;

a phase-lock loop in which said oscillator is connected for controlling an output frequency/phase of the oscillator and including a comparator for comparing the output frequency/phase of the oscillator with a reference frequency signal; and a digital frequency generator for deriving a reference signal in predetermined frequency steps from a fixed-frequency oscillator signal and for supplying the derived reference signal to said comparator for comparison with the output frequency/phase of the oscillator.

9. An arrangement according to claim 8, wherein said transmitting frequency is at least $10^{10}$ Hz.

10. An arrangement according to claim 8, wherein a dwell time for each frequency step is less than 500 $\mu$s.

11. An arrangement according to claim 8, wherein the distance to be measured is the distance to a level of a liquid inside a tank.

* * * * *